United States Patent
Hayashi et al.

(10) Patent No.: US 7,374,652 B2
(45) Date of Patent: *May 20, 2008

(54) PLATING METHOD

(75) Inventors: Shinjiro Hayashi, Saitama (JP); Hideki Tsuchida, Hasuda (JP); Masaru Kusaka, Saitama (JP); Koichi Yomogida, Saitama (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 6 days.

This patent is subject to a terminal disclaimer.

(21) Appl. No.: 11/482,890

(22) Filed: Jul. 7, 2006

(65) Prior Publication Data

US 2007/0007143 A1    Jan. 11, 2007

(51) Int. Cl.
C25D 5/02 (2006.01)
C25D 5/56 (2006.01)
C25D 3/38 (2006.01)

(52) U.S. Cl. .............. 205/125; 205/164; 205/296; 205/297; 205/298

(58) Field of Classification Search ............. 205/125, 205/164, 296, 297, 298
See application file for complete search history.

(56) References Cited

U.S. PATENT DOCUMENTS 4,897,165 A    1/1990   Bernards et al. ............. 204/24
5,051,154 A    9/1991   Bernards et al. ............. 204/24
6,800,188 B2 * 10/2004  Hagiwara et al. ........... 205/296
2003/0106802 A1 6/2003  Hagiwara .................... 205/297
2006/0016693 A1* 1/2006  Wang et al. ................. 205/291

FOREIGN PATENT DOCUMENTS

| EP | 1 371 757 | 12/2003 |
| EP | 1 619 274 | 7/2005 |
| WO | WO 2004005528 A2 * | 1/2004 |

OTHER PUBLICATIONS

Website: http://www.circuitree.com/CDA/ArticleInformation/features/BNP_Features_Item/0,2133; Allardyce et al.; Copper Electroplating Technology for Microvia Filing; Posted Mar. 1, 2004.
Website: http://www.dynatronix.com/copper.htm; Leisner et al.; Throwing Power in Pulse Reverse Plating from an Acid Copper Bath; Jun. 2, 2005.

* cited by examiner

Primary Examiner—Edna Wong
(74) Attorney, Agent, or Firm—S. Matthew Cairns; John J. Piskorski

(57) ABSTRACT

Copper plating baths containing a leveling agent that is a reaction product of a compound including a heteroatom chosen from nitrogen, sulfur and a mixture of nitrogen and sulfur, with a polyepoxide compound containing an ether linkage that deposit copper on the surface of an electronic device and in apertures on such substrate are provided. Such plating baths deposit a copper layer on the substrate surface that is substantially planar across a range of electrolyte concentrations. Methods of depositing copper layers using such copper plating baths are also disclosed.

6 Claims, 1 Drawing Sheet

Fig. 1
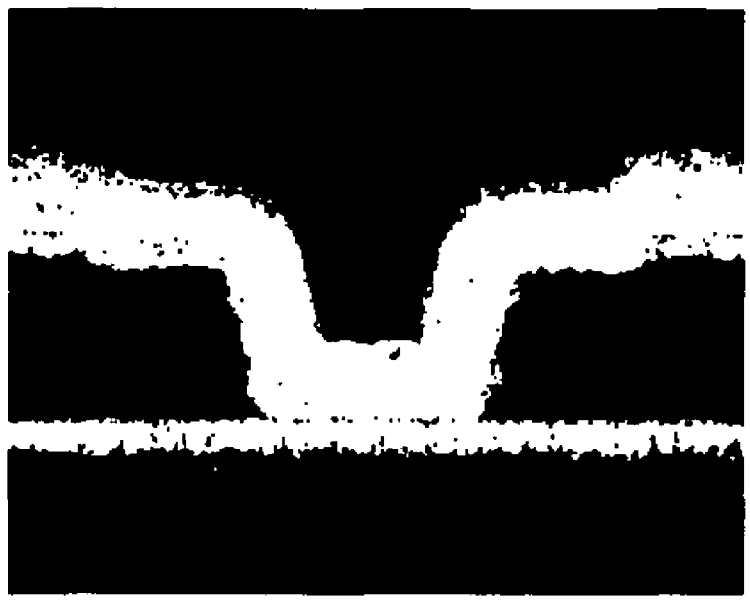
Fig. 2 – Prior Art

PLATING METHOD

The present invention relates generally to the field of electrolytic plating. In particular, the present invention relates to the field of electrolytic plating of copper.

Methods for electroplating articles with metal coatings generally involve passing a current between two electrodes in a plating solution where one of the electrodes is the article to be plated. A typical acid copper plating solution comprises dissolved copper (usually copper sulfate), an acid electrolyte such as sulfuric acid in an amount sufficient to impart conductivity to the bath, and proprietary additives to improve the uniformity of the plating and the quality of the metal deposit. Such additives include accelerators, levelers, surfactants, suppressors, and the like.

Electrolytic copper plating solutions are used for many industrial applications. For example, they are used in the automotive industry to deposit base layers for subsequently applied decorative and corrosion protective coatings. They are also used in the electronics industry, particularly for the fabrication of printed circuit boards and semiconductors. For circuit board fabrication, copper is electroplated over selected portions of the surface of a printed circuit board, into blind vias and onto the walls of through holes passing between the surfaces of the circuit board base material. The walls of a through hole are first metallized to provide conductivity between the board's circuit layers. For semiconductor fabrication, copper is electroplated over the surface of a wafer containing a variety of features such as vias, trenches or a combination thereof. The vias and trenches are metallized to provide conductivity between various layers of the semiconductor device.

It is well known in certain areas of plating, such as in electroplating of printed circuit boards, that the use of accelerators and/or levelers in the electroplating bath can be crucial in achieving a uniform metal deposit on a substrate surface. Plating a substrate having irregular topography can pose particular difficulties. During electroplating a voltage drop variation typically will exist along an irregular surface which can result in an uneven metal deposit. Plating irregularities are exacerbated where the voltage drop variation is relatively extreme, i.e., where the surface irregularity is substantial. As a result, a thicker metal deposit, termed overplating, is observed over such surface irregularities. Consequently, high quality metal plating (e.g., a metal layer or plate of substantially uniform thickness) is frequently a challenging step in the manufacture of electronic devices. Leveling agents are often used in copper plating baths to provide substantially uniform, or level, copper layers in electronic devices. For example, U.S. Pat. No. 6,610,192 (Step et al.) discloses a method of producing level copper deposits by electroplating copper from a copper plating bath containing one or more leveling agents, wherein at least one leveling agent is a reaction product of a heterocyclic amine with an epihalohydrin. Even with such leveling agents, level and smooth copper deposits are not always produced. In particular, mounding can be a problem. "Mounding" refers to the excess plating (or overplating) of a metal such as copper over an aperture, e.g. a blind via.

A challenge exists in the manufacture of printed circuit boards ("PCBs") where the trend of portability combined with increased functionality of electronic devices has driven the miniaturization of PCBs. Conventional multilayer PCBs with through hole interconnect vias are not always a practical solution. Alternative approaches for high density interconnects have been developed, such as sequential build up technologies, which utilize blind vias. One of the objectives in processes that use blind vias is the maximizing of via filling while minimizing thickness variation in the copper deposit across the substrate surface. This is particularly challenging when the PCB contains both through holes and blind vias.

Generally, copper plating bath additives that provide better leveling of the deposit across the substrate surface tend to worsen the throwing power of the electroplating bath. Throwing power is defined as the ratio of the hole center copper deposit thickness to its thickness at the surface. Newer PCBs are being manufactured that contain both through holes and blind vias. Current bath additives, in particular current leveling agents, do not provide level copper deposits on the substrate surface and fill through holes and/or fill blind vias effectively. There remains a need in the art for leveling agents for use in copper electroplating baths used in the manufacture of PCBs that provide level copper deposits while not significantly affecting the throwing power of the bath, i.e. fill blind vias and through holes.

It has been surprisingly found that the present invention provides metal layers, particularly copper layers, having a substantially level surface across a PCB substrate, even on substrates having very small features and on substrates having a variety of feature sizes. Such substantially level metal layers are provided from plating baths having a wide range of electrolyte concentration. It has been further surprisingly found that the present invention provides metal layers substantially without the formation of defects such as voids in the features, particularly in very small features. The present invention also provides copper deposits having a smooth surface, i.e. a low surface roughness.

In one embodiment, the present invention provides a copper electroplating bath including a source of copper ions, an electrolyte, and a reaction product of a compound including a heteroatom chosen from nitrogen, sulfur and a mixture of nitrogen and sulfur, with a polyepoxide compound containing an ether linkage, wherein the reaction product has a polydispersity of <2.5. Such reaction products are particularly useful as leveling agents in metal plating baths, such as copper plating baths. In addition, such leveling agents typically do not negatively impact the throwing power of the copper plating bath. The present copper electroplating baths may optionally contain one or more of an accelerator and a suppressor.

Further provided by the present invention is a method of depositing copper on a substrate including the steps of: contacting a substrate to be plated with copper with the copper plating bath described above; and then applying a current density for a period of time sufficient to deposit a copper layer on the substrate. Particularly suitable substrates are those used in the manufacture of electronic devices and more particularly printed circuit boards. Accordingly, the present invention provides a method of manufacturing an electronic device including the steps of: contacting an electronic device substrate, particularly a printed circuit board, with the copper plating bath described above; and then applying a current density for a period of time sufficient to deposit a copper layer on the substrate. The present method also deposits copper in blind vias and through holes on the printed circuit board.

FIG. 1 shows a cross-section of a blind via in a FOB plated with copper according to the invention.

FIG. 2 shows a cross-section of a blind via in a POB plated with copper using a conventional copper electroplating bath.

As used throughout this specification, the following abbreviations shall have the following meanings, unless the context clearly indicates otherwise: A=amperes; ASD=amperes per square decimeter; ° C.=degrees Centigrade; g=gram; mg=milligram; L=liter, ppm=parts per million; μm=micron=micrometer; mm=millimeters; cm=centimeters; DI=deionized; AR=aspect ratio; and mL=milliliter. All amounts are percent by weight and all ratios are molar ratios, unless otherwise noted. All numerical ranges are inclusive and combinable in any order, except where it is clear that such numerical ranges are constrained to add up to 100%.

As used throughout the specification, "feature" refers to the geometries on a substrate. "Apertures" refer to recessed features including through holes and blind vias. As used throughout this specification, the term "plating" refers to metal electroplating. "Deposition" and "plating" are used interchangeably throughout this specification. "Halide" refers to fluoride, chloride, bromide and iodide. Likewise, "halo" refers to fluoro, chloro, bromo and iodo. The term "alkyl" includes linear, branched and cyclic alkyl. "Accelerator" refers to an organic additive that increases the plating rate of the electroplating bath. A "suppressor" refers to an organic additive that suppresses the plating rate of a metal during electroplating. "Leveler" refers to an organic compound that is capable of providing a substantially level (or planar) metal layer. The terms "levelers" and "leveling agents" are used interchangeably throughout this specification. The terms "printed circuit boards" and "printed wiring boards" are used interchangeably throughout this specification. The articles "a" and "an" refer to the singular and the plural.

The present invention provides an essentially level plated metal layer, particularly a plated copper layer, on a substrate, such as a printed circuit board. When the substrate contains small features, the plated metal layer has reduced overplating as compared to conventionally plated metal layers and the metal deposited in the small features, particularly blind vias, is substantially free of voids, and preferably free of voids. "Overplating" refers to a thicker metal deposit over dense aperture areas as compared to areas free of apertures or at least containing relatively few apertures. The term "relatively few apertures" means an area containing up to 10%, and preferably up to 5%, of the total number of apertures of a comparative area having many such apertures, "dense aperture areas", within the same device.

Any substrate upon which copper can be electroplated is useful in the present invention. Such substrates include, but are not limited to, electronic devices such as printed wiring boards, integrated circuits, semiconductor packages, lead frames and interconnects. Particularly useful substrates are any used in the manufacture of electronic devices, such as integrated circuits, and more particularly wafers used in dual damascene manufacturing processes. Such substrates typically contain a number of features, particularly apertures, having a variety of sizes. Through holes in a PCB may have a variety of diameters, such as up to a few millimeters. For example, through holes may vary from 50 μm to 3 mm in diameter. PCBs may contain blind vias having a wide variety of sizes, such as up to 200 μm, or greater. The present invention is particularly suitable for filling apertures, of varying aspect ratios, such as low aspect ratio vias and high aspect ratio apertures. By "low aspect ratio" is meant an aspect ratio of from 0.1:1 to 4:1. The term "high aspect ratio" refers to aspect ratios of greater than 4:1, such as 10:1 or 20:1.

The present invention provides a method of depositing copper on a printed circuit board including contacting the printed circuit board having blind vias with a copper electroplating bath including a source of copper ions, an electrolyte, and a leveling agent that is a reaction product of a compound including a heteroatom chosen from nitrogen, sulfur and a mixture of nitrogen and sulfur, with a polyepoxide compound containing an ether linkage; and then applying a current density for a period of time sufficient to deposit a copper layer on the substrate, wherein the reaction product has a polydispersity of <2.5. Such copper plating bath is typically aqueous. Typically, the copper plating bath includes one or more of an accelerator and a suppressor. Optionally, the plating bath may contain a halide ion.

As used herein, the term "polydispersity" is defined as the weight average molecular weight ("Mw") of the reaction product leveling agent divided by the number average molecular weight ("Mn") of the reaction product. Molecular weights may be determined using any conventional technique, such as end group analysis, ebulliometry, cryoscopy, osmometry, gel-permeation chromatography ("GPC"), and light scattering. See, e.g. F. W. Billmeyer, Textbook of Polymer Science, 2$^{nd}$ ed., Wiley-Interscience, New York, 1971, pp 62-96, for a description of such techniques. Both the Mw and Mn molecular weights used herein are determined by GPC. The molecular weights of the reaction products were determined by GPC against a calibration curve of a series of polyethylene glycol standards ranging in molecular weight from 106 to 168,000.

The leveling agent reaction product of the invention has a polydispersity in the range of 1 to <2.5. Typically, the polydispersity is ≦2.3 and more typically ≦2. In one embodiment, the polydispersity is in the range of 1.2 to 2.3, more typically from 1.2 to 2, and still more typically from 1.5 to 2.

Compounds containing a heteroatom that may be used to prepare the reaction products of the present invention may be polymeric or non-polymeric. Exemplary polymeric compounds include, without limitation, polyethylenimine and polyamidoamine. A variety of autnes may be used as the compound containing a heteroatom. Such amines may be primary-, secondary- or tertiary-alkyl amines, aryl amines or heterocyclic amnines. Exemplary ainines include, but are not limited to, dialkylamines, trialkylamines, arylalkylamines. diarylamines, iniidazole, triazole, tetrazole, berjzimidazole, benzotriazole, piperidine, morpholine, piperazine, pyridine, oxazole, benzoxazole, pyrimidine, quinoline, and isoquinoline. Imnidazole and pyridine are particularly suitable. Exemplary sulfur-containing compounds include thiourea and substituted thioureas. By "substituted", it is meant that one or more of the hydrogens are replaced by one or more substituent groups. A wide variety of substituent groups may be used, including amino, alicylamino, diallcylamino, alkyl, aryl, alkenyl, alloxyl, and halo. Other suitable non-polymeric heteroatom-containing compounds include nigrosines, pentamethyl-para-rosaniline hydrohalide, hexamethyl-para-rosaniline hydrohalide and compounds containing a functional group of the formula N-R-S, where R is a substituted alkyl, unsubstituted alkyl, substituted aryl or unsubstituted aryl. Typically, the alkyl groups are ($C_1$-$C_6$) alkyl and preferably ($C_1$-$C_4$)allcyl. in general, the aryl groups include ($C_6$-$C_{20}$)aryl, preferably ($C_6$-$C_{10}$)aryl. Such aryl groups may further include heteroatoms, such as sulfur, nitrogen and oxygen. It is preferred that the aryl group is phenyl or napthyl.

Suitable polyepoxide compounds are those having 2 or more epoxide moieties joined together by an ether-containing linkage. Exemplary polyepoxide compounds are those of formula (I)

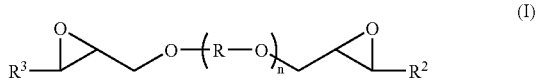

(I)

wherein R is $(C_1-C_{10})$alkyl; and $R^2$ and $R^3$ are independently chosen from H and R, wherein n=1–20. Typically, n=1–10 and more typically n=1–5. In one embodiment, n=1. In a further embodiment, $R^2$ and $R^3$ are both H. In another embodiment, R is optionally substituted. By "substituted" it is meant that one or more hydrogens are replaced with one or more substituent groups, such as hydroxyl, $(C_1-C_4)$ alkoxy, thiol, amino, $(C_1-C_4)$alkylamino, and di$(C_1-C_4)$alkylamino. While the polyepoxide compounds of formula (I) have two epoxy groups, it will be appreciated by those skilled in the art that polyepoxide compounds having three or more epoxy groups may be used.

Exemplary compounds of formula (I) include, without limitation, 1,4-butanediol diglycidyl ether, ethylene glycol diglycidyl ether, diethylene glycol diglycidyl ether, triethylene glycol diglycidyl ether, glycerol diglycidyl ether, neopentyl glycol diglycidyl ether, propylene glycol diglycidyl ether, dipropylene glycol diglycidyl ether, and poly(propylene glycol) diglycidyl ether. A suitable poly(propylene glycol) diglycidyl ether is one having a number average molecular weight of 380, although other average molecular weights may be used. Such polyepoxide compounds are generally available from a variety of sources, such as Aldrich (Milwaukee, Wis.), and may be used without further purification.

In one embodiment, the amine is imidazole and the polyepoxide compound is a diepoxide compound of formula (I). In another embodiment, the amine is pyridine and the polyepoxide compound is a diepoxide compound of formula (I).

Reaction products of amines with the polyepoxides of formula (I) can be prepared by dissolving a desired amount of the amine in water and heating the solution to approximately 40 to 90° C. with stirring. The polyepoxide compound is then added to the solution with continued stirring. Following addition of the polyepoxide compound, the reaction mixture is heated to approximately 75 to 95° C. for 4 to 8 hours. After stirring for 12 to 18 hours, the reaction mixture is then diluted with water and the pH is adjusted to a value of approximately 7.

Exemplary reaction products of a compound a heteroatom with a polyepoxide have a Mn value of 1000 to 10,000, although reaction products having other Mn values may be used. Such reaction products may have a Mw value in the range of 1000 to 50,000, although other Mw values may be used. Typically, Mw is from 1000 to 20,000. In one embodiment, Mw is 1500 to 5000. In another embodiment, Mw is 5000 to 15,000.

Typically, the ratio of the heteroatom-containing compound to polyepoxide used to prepare the reaction product may be from 0.1:10 to 10:0.1. More typically, the ratio is 0.5:5 to 5:0.5 and still more typically from 0.5:1 to 1:0.5. Other suitable ratios of heteroatom-containing compound to polyepoxide may be used.

It will be appreciated by those skilled in the art that a leveling agent of the present invention may also possess functionality capable of acting as a suppressor. Such compounds may be dual-functioning, i.e. they may function as leveling agents and as suppressors.

The amount of the leveling agent used in the metal electroplating baths will depend upon the particular leveling agents selected, the concentration of the metal ions in the electroplating bath, the particular electrolyte used, the concentration of the electrolyte and the current density applied. In general, the total amount of the leveling agent in the electroplating bath is from 0.5 ppm to 10,000 ppm based on the total weight of the plating bath, although greater or lesser amounts may be used. Typically, the total amount of the leveling agent is from 1 to 5000 ppm and more typically from 5 to 1000 ppm.

The leveling agents useful in the present invention are generally commercially available or may be prepared by methods known in the literature. Such leveling agents may be used as is or may be further purified.

Any metal ion source that is at least partially soluble in the electroplating bath and which metal can be deposited electrolytically is suitable. Typically, the metal ion source is soluble in the plating bath. Suitable metal ion sources are metal salts and include without limitation metal sulfates, metal halides, metal acetates, metal nitrates, metal fluoroborates, metal alkylsulfonates, metal arylsulfonates, metal sulfamates, and metal gluconates. In one embodiment, the metal is copper. Suitable sources of copper ions include, but are not limited to, copper sulfate, copper chloride, copper acetate, copper nitrate, copper fluoroborate, copper methane sulfonate, copper phenyl sulfonate, copper phenol sulfonate and copper p-toluene sulfonate. Copper sulfate pentahydrate is particularly suitable. Mixtures of metal ion sources may be used, such as, for example, a mixture of a tin ion source and a copper ion source. Such mixtures of metal ion sources are useful in the deposition of metal alloys. Such metal salts are generally commercially available and may be used without further purification.

The metal salts may be used in the present invention in any amount that provides sufficient metal ions for electroplating on a substrate. When the metal is copper, the copper salt is typically present in an amount sufficient to provide an amount of copper metal of 10 to 180 g/L of plating solution. Alloys, such as copper-tin, for example, copper having up to 2% by weight tin, may be advantageously plated according to the present invention. Other suitable copper alloys include, but are not limited to copper-silver, tin-copper-silver, and tin-copper-bismuth. The amount of each of the metal salts in such mixtures depends upon the particular alloy to be plated and is well known to those skilled in the art.

The electrolyte useful in the present invention may be alkaline or acidic. Suitable acidic electrolytes include, but are not limited to, sulfuric acid, acetic acid, fluoroboric acid, alkanesulfonic acids such as methanesulfonic acid, ethanesulfonic acid, propanesulfonic acid and trifluoromethane sulfonic acid, arylsulfonic acids such as phenyl sulfonic acid, phenol sulfonic acid and toluene sulfonic acid, sulfamic acid, hydrochloric acid, and phosphoric acid. Mixtures of acids may be advantageously used in the present metal plating baths. Preferred acids include sulfuric acid, methanesulfonic acid, ethanesulfonic acid, propanesulfonic acid, and mixtures thereof. Such electrolytes are generally commercially available from a variety of sources and may be used without further purification. The acids are typically present in an amount in the range of from 1 to 300 g/L, more typically from 5 to 250 g/L, and still more typically from 10 to 225 g/L.

Such electrolytes may optionally contain a source of halide ions, such as chloride ions such as copper chloride or hydrochloric acid. A wide range of halide ion concentrations may be used in the present invention. Typically, the halide ion concentration is in the range of from 0 to 100 ppm based on the plating bath, and preferably from 10 to 100 ppm. A particularly useful amount of halide ion is 20 to 75 ppm. Such halide ion sources are generally commercially available and may be used without further purification.

Any accelerators (also referred to as brightening agents) are suitable for use in the present invention. Such accelerators are well-known to those skilled in the art. Typical accelerators contain one or more sulfur atoms and have a molecular weight of 1000 or less. Accelerator compounds that have sulfide and/or sulfonic acid groups are generally preferred, particularly compounds that include a group of the formula R'—S—R—SO$_3$X, where R is optionally substituted alkyl, optionally substituted heteroalkyl, optionally substituted aryl, or optionally substituted heterocyclic; X is a counter ion such as sodium or potassium; and R' is hydrogen or a chemical bond. Typically, the alkyl groups are (C$_1$-C$_{16}$)alkyl and preferably (C$_3$-C$_{12}$)alkyl. Heteroalkyl groups typically have one or more heteroatoms, such as nitrogen, sulfur or oxygen, in the alkyl chain. Suitable aryl groups include, but are not limited to, phenyl, benzyl, biphenyl and naphthyl. Suitable heterocyclic groups typically contain from 1 to 3 heteroatoms, such as nitrogen, sulfur or oxygen, and 1 to 3 separate or fused ring systems. Such heterocyclic groups may be aromatic or non-aromatic. Specific accelerators suitable for use in the present invention include, but are not limited to, N,N-dimethyl-dithiocarbamic acid-(3-sulfopropyl)ester; 3-mercapto-propylsulfonic acid-(3-sulfopropyl)ester; 3-mercapto-propylsulfonic acid sodium salt; carbonic acid-dithio-o-ethylester-s-ester with 3-mercapto-1-propane sulfonic acid potassium salt; bis-sulfopropyl disulfide; 3-(benzothiazolyl-s-thio)propyl sulfonic acid sodium salt; pyridinium propyl sulfobetaine; 1-sodium-3-mercaptopropane-1-sulfonate; N,N-dimethyl-dithiocarbamic acid-(3-sulfoethyl)ester; 3-mercapto-ethyl propylsulfonic acid-(3-sulfoethyl)ester; 3-mercapto-ethylsulfonic acid sodium salt; carbonic acid-dithio-o-ethylester-s-ester with 3-mercapto-1-ethane sulfonic acid potassium salt; bis-sulfoethyl disulfide; 3-(benzothiazolyl-s-thio)ethyl sulfonic acid sodium salt; pyridinium ethyl sulfobetaine; and 1-sodium-3-mercaptoethane-1-sulfonate.

Such accelerators may be used in a variety of amounts. In general, accelerators are used in an amount of at least 1 mg/L, based on the bath, typically at least 1.2 mg/L, and more typically at least 1.5 mg/L. For example, the accelerators are present in an amount of from 1 mg/L to 200 mg/L. Particularly suitable amounts of accelerator useful in the present invention are at least 2 mg/L, and more suitably at least 4 mg/L. Even higher accelerator concentrations are suitable, such as at least 10, 15, 20, 30, 40 or 50 mg/L, based on the bath. A particularly useful range of such accelerator concentrations is from 5 to 50 mg/L.

Any compound capable of suppressing the metal plating rate may be used as a suppressor in the present electroplating baths. Suitable suppressors include, but are not limited to, polymeric materials, particularly those having heteroatom substitution, and more particularly oxygen substitution. Exemplary suppressors are high molecular weight polyethers, such as those of the formula:

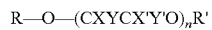

R—O—(CXYCX'Y'O)$_n$R' where R and R' are independently chosen from H, (C$_2$-C$_{20}$) alkyl group and (C$_6$-C$_{10}$)aryl group; each of X, Y, X' and Y' is independently selected from hydrogen, alkyl such as methyl, ethyl or propyl, aryl such as phenyl, or aralkyl such as benzyl; and n is an integer from 5 to 100,000. Typically, one or more of X, Y, X' and Y' is hydrogen. Particularly suitable suppressors include commercially available polypropylene glycol copolymers and polyethylene glycol copolymers, including ethylene oxide-propylene oxide ("EO/PO") copolymers and butyl alcohol-ethylene oxide-propylene oxide copolymers. Suitable butyl alcohol-ethylene oxide-propylene oxide copolymers are those having a weight average molecular weight of 1500 to 10,000. When such suppressors are used, they are typically present in an amount in the range of from 1 to 10,000 ppm based on the weight of the bath, and preferably from 5 to 10,000 ppm.

Particularly suitable compositions useful as electroplating baths in the present invention include a soluble copper salt, an acid electrolyte, a reaction product described above as a leveling agent, an accelerator, a suppressor and halide ion. More particularly, suitable compositions include 10 to 220 g/L of a soluble copper salts as copper metal, 5 to 250 g/L of acid electrolyte, 1 to 50 mg/L of an accelerator, 1 to 10,000 ppm of a suppressor, 10 to 100 ppm of a halide ion, and 1 to 5000 ppm of a reaction product described above as a leveling agent.

In another embodiment, the present invention provides a copper electroplating bath including a source of copper ions, an electrolyte, and a reaction product of a compound including a heteroatom chosen from nitrogen, sulfur and a mixture of nitrogen and sulfur, with a polyepoxide compound containing an ether linkage, wherein the reaction product has a polydispersity of <2.5.

The electroplating baths of the present invention may be prepared by combining the components in any order. It is preferred that the inorganic components such as metal salts, water, electrolyte and optional halide ion source, are first added to the bath vessel followed by the organic components such as leveling agent, accelerator, suppressor, and any other organic component.

Typically, the plating baths of the present invention may be used at any temperature from 10° to 65° C. or higher. More typically, the temperature of the plating baths is from 10° to 35° C. and still more typically from 15° to 30° C.

In general, the present copper electroplating baths are agitated during use. Any suitable agitation method may be used with the present invention and such methods are well-known in the art. Suitable agitation methods include, but are not limited to, air sparging, work piece agitation, and impingement.

Typically, substrates are electroplated by contacting the substrate with the plating bath of the present invention. The substrate typically functions as the cathode. The plating bath contains an anode, which may be soluble or insoluble. Potential is typically applied to the cathode. Sufficient current density is applied and plating performed for a period of time sufficient to deposit a copper layer having a desired thickness on the substrate as well as fill blind vias and/or through holes. Suitable current densities, include, but are not limited to, the range of 0.1 to 10 ASD, although higher and lower current densities may be used. The specific current density depends in part upon the substrate to be plated and the leveling agent selected. Such current density choice is within the abilities of those skilled in the art.

The present invention is useful for depositing a copper layer on a variety of substrates, particularly those having variously sized apertures. Accordingly, the present invention provides a method of depositing a copper layer on a substrate including the steps of: contacting a substrate to be plated with copper with the copper plating bath described above; and then applying a current density for a period of time sufficient to deposit a copper layer on the substrate. For example, the present invention is particularly suitable for depositing copper on printed circuit boards with blind vias and through holes.

Copper is deposited in apertures according to the present invention without substantially forming voids within the metal deposit. By the term "without substantially forming voids", it is meant that >95% of the plated apertures are void-free. It is preferred that the plated apertures are void-free.

While the process of the present invention has been generally described with reference to printed circuit board manufacture, it will be appreciated that the present invention may be useful in any electrolytic process where an essentially level or planar copper deposit and filled apertures that are substantially free of voids are desired. Such processes include semiconductor packaging and interconnect manufacture.

An advantage of the present invention is that substantially level copper deposits are obtained on a PCB. By "substantially level" copper layer is meant that the step height, i.e., the difference between areas of dense very small apertures and areas free of or substantially free of apertures, is less than 5 μm, and preferably less than 1 μm. Through holes and/or blind vias in the PCB are substantially filled with substantially no void formation. Further, such copper deposits have reduced nodules formation as compared to conventional copper plating processes. A further advantage of the present invention is that a wide range of apertures and aperture sizes may be filled within a single substrate with substantially no suppressed local plating. Thus, the present invention is particularly suitable for filling blind vias and/or through holes in a printed circuit board, where such blind vias and through holes are substantially free of added defects. "Substantially free of added defects" refers to the leveling agent not increasing the number or size of defects, such as voids, in filled apertures as compared to control plating baths not containing such leveling agent. A further advantage of the present invention is that a substantially planar copper layer may be deposited on a PCB having non-uniformly sized apertures. "Non-uniformly sized apertures" refer to apertures having a variety of sizes in the same PCB.

EXAMPLE 1

Imidazole (225 g) was dissolved in water (563 mL) in a reaction vessel. The mixture was heated to 80° C. with stirring. With continued stirring, 607.5 mL of a 60.8% solution of 1,4-butanediol diglycidyl ether ("BDE"), which is a diepoxy-functional compound having the formula

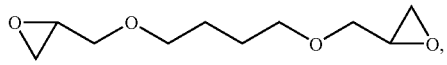

in water was added to the reaction vessel at a rate of 82.7 mL/min. After the addition of the BDE, the temperature of the mixture was maintained at 95° ±3° C. for 5.5 to 6 hours with stirring. Following heating, the mixture was allowed to stir for 16-18 hours. The pH of the reaction product mixture was then set to a value of 6-7 using sulfuric acid. The reaction product was then transferred to a suitable container and diluted with DI water as needed. This reaction product had a polydispersity of <2.5 and a Mw of approximately 14,000.

EXAMPLE 2

The procedure of Example 1 was repeated except that the leveler used was a 1:0.6 reaction product of imidazole with BDE and that the reaction product had a Mn value of 2700-2900, a Mw value of 4500-4700 and a polydispersity of 1.6-1.7.

EXAMPLE 3

A copper plating bath was prepared by combining 40 g/L copper as copper sulfate, 10 g/L sulfuric acid, 50 ppm chloride ion, 10 mL/L of an accelerator and 3 mL/L of a suppressor. The accelerator was a disulfide compound having sulfonic acid groups and a molecular weight of <1000. The suppressor was an EO/PO copolymer having a molecular weight of <5,000 and terminal hydroxyl groups. The plating bath also contained 1 mL/L of the reaction product from Example 1.

EXAMPLE 4

A copper plating bath was prepared by combining 75 g/L copper as copper sulfate pentahydrate, 190 g/L sulfuric acid, 50 ppm chloride ion, 1-5 ppm of an accelerator and 500 ppm of a suppressor. The accelerator was a disulfide compound having sulfonic acid groups and a molecular weight of <1000. The suppressor was an EO/PO copolymer having a molecular weight of <5,000. The plating bath also contained 250-300 ppm of the reaction product from Example 2 as a leveling agent.

EXAMPLE 5

A 1.6 mm thick PCB having through holes (0.3 mm diameter) was plated using copper plating baths according to Example 4. The amount of the accelerator in each bath varied from 2 to 4 ppm. The amount of leveling agent varied from 250 to 300 ppm. The temperature of the baths was 25° C. A current density of 3 ASD) was applied to each bath for 50 minutes. The target copper deposit thickness on the PCB was 33 μm. The throwing power of the baths varied from approximately 73-83%. A conventional commercial copper plating bad containing the same components in the same amounts (2 ppm accelerator) except for a different leveling agent was also tested under the same conditions. The commercial bath had a throwing power of 70%.

EXAMPLE 6

A PCB having blind via holes (100 μm diameter and 60 μm depth) was plated using the copper plating bath of Example 4. The amount of the accelerator the each bath varied from 3 to 4 ppm. The amount of leveling agent varied from 250 to 300 ppm. The temperature of the baths was 25° C. A current density of 2 ASD was applied to each bath for 80 minutes. The target copper deposit thickness on the PCB was 35 μm. The throwing power of the baths for plating blind vias varied from approximately 130-140%. FIG. 1 shows a cross-section of a blind via plated using the bath of Example 4 containing 3 ppm accelerator and 300 ppm of leveling agent. The throwing power of this bath as approximately 140%.

The conventional commercial copper plating bath used in Example 5 was also tested and found to have a throwing power of approximately 90%. A cross-section of a blind via plated using this conventional copper plating bath is shown in FIG. 2.

As can be seen from these data, the plating baths of the invention have better throwing power for plating blind vias than conventional copper plating baths.

EXAMPLE 7

A 5×10 cm PCB was added to each of 4 copper plating baths. Each bath contained 75 g/L copper as copper sulfate pentahydrate, 190 g/L sulfuric acid, 50 ppm chloride ion, and 500 ppm of a an EO/PO copolymer having a molecular weight of <5,000 as a suppressor. Bath 1 also contained 3 ppm of a disulfide compound having sulfonic acid groups and a molecular weight of <1000 as an accelerator and 250 ppm of the reaction product from Example 2 as a leveling agent. Bath 2 was the same as Bath 1 except that the accelerator was present at 4 ppm. Bath 3 was the same as Bath 1 except that the leveling agent was present at 300 ppm. Bath 4 (Comparative) was the conventional commercial copper plating bath from Example 5.

The temperature of each plating bath was 25° C. A current density of 3 ASD was applied to each bath for 50 minutes. The target copper deposit thickness on the PCB was 33 μm. Following copper plating, the boards were removed from the plating bath, rinsed and dried. Both sides of the boards were then visually inspected for the presence of copper nodules. The total number of copper nodules found on each board is reported below.

| Bath | Number of Nodules |
|---|---|
| 1 | 234 |
| 2 | 231 |
| 3 | 181 |
| 4 (Comparative) | 1104 |

The above data clearly show that the present copper plating baths produce fewer nodules than conventional copper plating baths.

What is claimed is:

1. A method of depositing copper on a printed circuit board comprising contacting a printed circuit board having blind vias with a copper electroplating bath comprising a source of copper ions, an electrolyte, and a leveling agent that is a reaction product of a compound selected from the group consisting of imidazole, triazole, tetrazole, benzimidazole, benzotriazole, piperidine, morpholine, piperazine, pyridine, oxazole, benzoxazole, pyrimidine, quinoline, and isoquinoline, with a polyepoxide compound containing an ether linkage; and then applying a current density for a period of time sufficient to deposit a copper layer on the printed circuit board, wherein the reaction product has a polydispersity of <2.5.

2. The method of claim 1 wherein the polydispersity is <2.

3. The method of claim 1 wherein the polyepoxide compound has the formula (I)

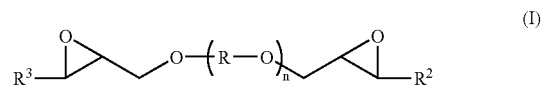

wherein R is $(C_1-C_{10})$alkyl; and $R^2$ and $R^3$ are independently chosen from H or R, wherein n =1-20.

4. The method of claim 1 wherein the printed circuit board further comprises through holes.

5. The method of claim 1 wherein the copper electroplating bath has a throwing power of 70%.

6. The method of claim 1 wherein the compound is selected from the group consisting of imidazole and pyridine.

* * * * *